United States Patent
Lee et al.

(10) Patent No.: US 9,620,688 B2
(45) Date of Patent: Apr. 11, 2017

(54) DISPLAY DEVICE

(71) Applicant: LG DISPLAY CO., LTD., Seoul (KR)

(72) Inventors: Sang-Hyun Lee, Paju-si (KR); Won-Taek Moon, Paju-si (KR); Sun-Woong Kim, Paju-si (KR); Bo-Ra Kim, Goyang-si (KR); Sang-Dae Han, Paju-si (KR); Su-Jin Chang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 139 days.

(21) Appl. No.: 14/137,255

(22) Filed: Dec. 20, 2013

(65) Prior Publication Data
US 2014/0183571 A1 Jul. 3, 2014

(30) Foreign Application Priority Data
Dec. 28, 2012 (KR) .................. 10-2012-0157005

(51) Int. Cl.
*G02F 1/1335* (2006.01)
*H01L 33/58* (2010.01)
(Continued)

(52) U.S. Cl.
CPC ............ *H01L 33/58* (2013.01); *G02B 5/0221* (2013.01); *G02B 5/0278* (2013.01);
(Continued)

(58) Field of Classification Search
CPC ...... G02B 6/00; G02B 6/0053; G02B 5/0221; G02B 5/0226; G02B 5/0278;
(Continued)

(56) References Cited

U.S. PATENT DOCUMENTS

2005/0128582 A1* 6/2005 Gibilini .................... 359/455
2005/0205956 A1* 9/2005 Oda .................. H01L 27/14627
257/432
(Continued)

FOREIGN PATENT DOCUMENTS

CN   1444057 A   9/2003
CN   1985210 A   6/2007
(Continued)

OTHER PUBLICATIONS

Extended European Search Report issued in corresponding European Patent Application No. 13196426.4, mailed Apr. 29, 2014, 7 pages.
(Continued)

*Primary Examiner* — Nathanael R Briggs
*Assistant Examiner* — William Peterson
(74) *Attorney, Agent, or Firm* — Brinks Gilson & Lione (57) ABSTRACT

A display device includes a micro-lens film which has a high fill-factor and a high luminance ratio and prevents generation of moiré. The display device includes a display panel configured to display an image, a plurality of Light Emitting Diodes (LEDs) configured to generate light to supply light to the display panel, a light guide panel configured to guide light to the display panel, and a micro-lens film including a base film that concentrates and diffuses light emitted from the light guide panel, a lens unit at an upper surface of the base film, and a back-coating film at a lower surface of the base film. The lens unit includes unit block groups randomly arranged at the upper surface of the base film, each unit block group containing randomly arranged fixed-shape lenses having different sizes, and micro-beads randomly formed on surfaces of the fixed-shape lenses.

19 Claims, 10 Drawing Sheets

(51) Int. Cl.
  *G02B 5/02* (2006.01)
  *F21V 8/00* (2006.01)
  *H01L 27/15* (2006.01)

(52) U.S. Cl.
  CPC ..... *G02B 6/0053* (2013.01); *G02F 1/133615* (2013.01); *H01L 27/156* (2013.01)

(58) Field of Classification Search
  CPC ... G02F 2001/133607; G02F 1/133615; H01L 33/58; H01L 27/156
  USPC .......................................................... 349/62
  See application file for complete search history.

(56) References Cited

U.S. PATENT DOCUMENTS

| | | | |
|---|---|---|---|
| 2008/0225207 A1* | 9/2008 | Kim et al. | 349/95 |
| 2009/0135501 A1* | 5/2009 | Lee et al. | 359/707 |
| 2011/0135292 A1* | 6/2011 | Iwane | 396/113 |
| 2011/0234942 A1* | 9/2011 | Nakagome et al. | 349/64 |
| 2012/0212828 A1 | 8/2012 | Cho et al. | |

FOREIGN PATENT DOCUMENTS

| | | |
|---|---|---|
| CN | 101095071 A | 12/2007 |
| CN | 101278229 A | 10/2008 |
| CN | 101918867 A | 12/2010 |
| EP | 1 347 312 A1 | 9/2003 |
| JP | 2004-333537 | 11/2004 |
| KR | 1020080029168 A | 4/2008 |
| KR | 1020090111024 A | 10/2009 |
| KR | 1020100070609 A | 6/2010 |
| TW | 200841090 A | 10/2008 |
| TW | 200912465 A | 3/2009 |
| TW | 201248211 A | 12/2012 |

OTHER PUBLICATIONS

Office Action issued in Taiwanese Patent Application No. 102147033, mailed Mar. 12, 2015, 7 pages.

Office Action dated Mar. 1, 2016 for Chinese Patent Application No. 201310728435.3, 16 pages.

\* cited by examiner

GAP LINE

FIG. 11B
RELATED ART

GAP

DISPLAY DEVICE

This application claims the benefit of priority to Korean Patent Application No. 10-2012-0157005, filed on Dec. 28, 2012, which is hereby incorporated by reference as if fully set forth herein.

BACKGROUND

Field of the Disclosure

The present disclosure relates to a display device including a micro-lens film, and more particularly to a display device including a micro-lens film, which has a high fill-factor and a high luminance ratio and may prevent generation of moiré.

Discussion of the Related Art

Liquid crystal display devices display an image by regulating light transmittance of dielectric anisotropic liquid crystals using an electric field. A typical liquid crystal display device includes a liquid crystal display panel that consists of a thin film transistor substrate and a color filter substrate bonded to face each other, a backlight unit configured to emit light to the liquid crystal display panel, and a drive circuit configured to drive the liquid crystal display panel.

The aforementioned backlight unit includes a light source configured to generate light, a light guide panel configured to guide light so as to emit light to the liquid crystal display panel, a reflective sheet disposed below the light guide panel to reflect light to the liquid crystal display panel, and a micro-lens film for diffusion and concentration of light emitted from the light guide panel.

Figure 1:
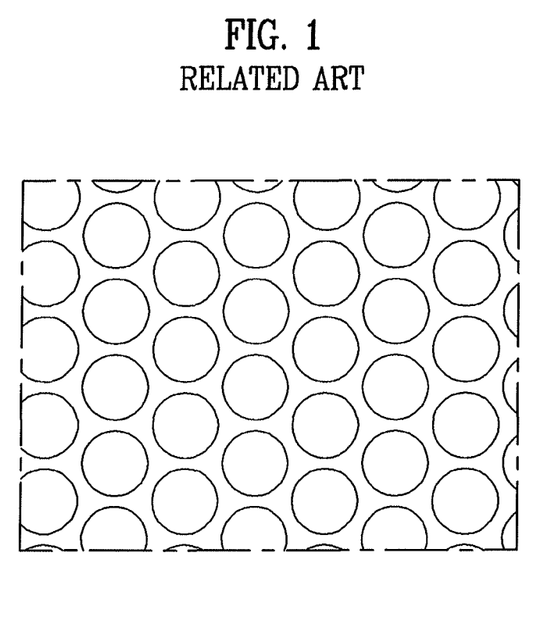
FIG. 1 is a view showing a fixed-shape micro-lens film of the related art.

Here, the micro-lens film is classified into a fixed-shape micro-lens film and an unfixed-shape micro-lens film. In the case of the fixed-shape micro-lens film, as exemplarily shown in FIG. 1, lenses take the form of circular semi-spheres having the same size and are regularly arranged. The fixed-shape micro-lens film having a regular arrangement of lenses may achieve a high fill-factor and consequently a high luminance ratio, but cause generation of moiré as the regular arrangement of lenses overlaps the display panel, which results in deterioration of image quality and makes it difficult for the micro-lens film to be applied as an uppermost optical sheet.

Figure 2:
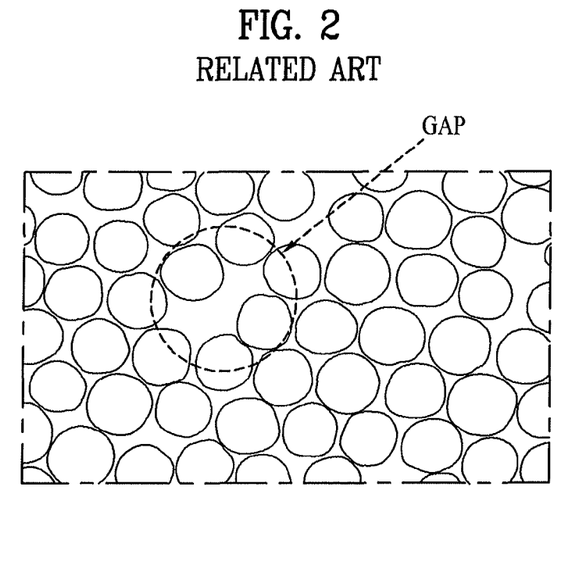
FIG. 2 is a view showing a unfixed-shape micro-lens film of the related art.

In the case of the unfixed-shape micro-lens film, as exemplarily shown in FIG. 2, lenses take the form of oval semi-spheres other than circular semi-spheres having different sizes and are irregularly arranged. The unfixed-shape micro-lens film having an irregular arrangement of oval lenses may prevent generation of moiré. However, the irregular arrangement of lenses, as exemplarily shown in FIG. 2, may cause sparkles that are perceived as sparkling spots in large gaps, which results in deterioration of image quality as well as reduction of a luminance ratio due to a low fill-factor.

As described above, the fixed-shape micro-lens film causes generation of moiré, whereas the unfixed-shape micro-lens film causes generation of sparkling spots due to large gaps between lenses as well as a low luminance ratio due to a low fill-factor.

SUMMARY

A display device includes a display panel configured to display an image, a plurality of Light Emitting Diodes (LEDs) configured to generate light to supply light to the display panel, a light guide panel configured to guide light to the display panel, and a micro-lens film including a base film that concentrates and diffuses light emitted from the light guide panel, a lens unit at an upper surface of the base film, and a back-coating film at a lower surface of the base film. The lens unit includes unit block groups randomly arranged at the upper surface of the base film, each unit block group containing randomly arranged fixed-shape lenses having different sizes, and micro-beads randomly formed on surfaces of the fixed-shape lenses.

In accordance with another aspect of the present invention, a display device includes a display panel configured to display an image, a plurality of Light Emitting Diodes (LEDs) configured to generate light to supply light to the display panel, a light guide panel configured to guide light to the display panel, and a micro-lens film including a base film that concentrates and diffuses light emitted from the light guide panel, a lens unit at an upper surface of the base film, and a back-coating film at a lower surface of the base film, wherein the lens unit includes a plurality of lenses having a hexagonal bottom, and surfaces of the plurality of lenses are provided with irregular bosses.

In accordance with a further aspect of the present invention, a display device includes a display panel configured to display an image, a plurality of Light Emitting Diodes (LEDs) configured to generate light to supply light to the display panel, a light guide panel configured to guide light to the display panel, and a micro-lens film including a base film that concentrates and diffuses light emitted from the light guide panel, a lens unit at an upper surface of the base film, and a back-coating film at a lower surface of the base film, wherein the lens unit includes regularly arranged fixed-shape lenses, and micro-lenses subordinate to the respective fixed-shape lenses or formed between the fixed-shape lenses to minimize gaps between the regularly arranged fixed-shape lenses.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the present invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Hereinafter, embodiments of the present invention will be described in detail with reference to the accompanying drawings. Configurations and operational effects of the present invention will be clearly understood from the following detailed description. In the following detailed description of the present invention, it is noted that the same or similar elements are denoted by the same reference numerals even though they are depicted in different drawings, and a detailed description of known functions and configurations incorporated herein will be omitted when it may make the subject matter of the present invention rather unclear.

The exemplarily embodiments of the present invention will hereinafter be described in detail with reference to FIGS. 3 to 18.

Figure 3:
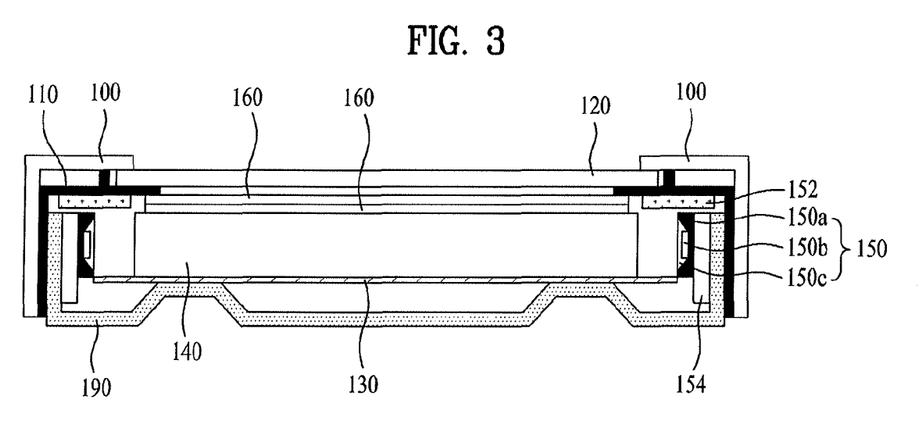
FIG. 3 is a sectional view showing a display device according to a first embodiment of the present invention.

FIG. 3 is a sectional view showing a display device according to a first embodiment of the present invention.

Referring to FIG. 3, the display device according to the first embodiment of the present invention includes a display panel that displays an image, a backlight unit that provides the display panel with light, a mold frame 110 on which the display panel is seated, a top case 100 coupled to the mold frame 110 to surround an edge of the display panel, and a bottom cover 190 to which the backlight unit is installed.

The display panel may be a liquid crystal display panel or organic field light emitting display panel, for example. In the following description, the liquid crystal display panel will be described by way of example.

The liquid crystal display panel, designated by reference numeral 120, includes a lower substrate provided with thin film transistors connected to gate lines and data lines, an upper substrate provided with color filters to generate colors, pixel electrodes connected to the thin film transistors, and a common electrode that creates a vertical field or horizontal field in conjunction with the pixel electrodes.

The color filters are formed on the upper substrate for color discrimination on the basis of a black matrix. The color filters are R, G, and B color filters to generate red, green, and blue.

The common electrode may be a transparent conductive film on a rear surface of the upper substrate to create a vertical field in conjunction with the pixel electrodes, or may be a transparent conductive film on the lower substrate to create a horizontal field in conjunction with the pixel electrodes. A reference voltage, i.e. common voltage for driving of liquid crystals is applied to the common electrode.

The thin film transistors are formed on the lower substrate to selectively supply data signals from the data lines to the pixel electrodes in response to gate signals from the gate lines. To this end, each thin film transistor includes a gate electrode connected to the gate line, a source electrode connected to the data line, a drain electrode connected to the pixel electrode, an active layer overlapping the gate electrode with a gate insulating film interposed therebetween to form a channel between the source electrode and the drain electrode, and an ohmic contact layer for ohmic contact between the active layer, the source electrode, and the drain electrode.

The pixel electrode is independently formed in each pixel area to overlap the color filters R, G, and B and is connected to the drain electrode of the thin film transistor. The pixel electrode creates a vertical field or horizontal field in conjunction with the common electrode, to which the common voltage is applied, upon receiving a data signal through the thin film transistor, thereby causing vertically aligned liquid crystal molecules to be rotated by dielectric anisotropy. Transmittance of light through the pixel area varies according to a rotation degree of the liquid crystal molecules, realizing a gray scale.

The above-described liquid crystal display panel may adopt a Twisted-Nematic (TN) mode in which electrodes are respectively arranged on two substrates to achieve 90 degree twisting of liquid crystal directors such that the liquid crystal directors are driven upon receiving voltage applied to the electrodes, an In-Plane Switching (IPS) mode in which two electrodes are arranged on a single substrate to regulate liquid crystal directors using a horizontal filed created between the two electrodes, and a Fringe Field Switching (FFS) mode in which two electrodes in the form of transparent conductors are spaced apart from each other by a narrow gap to drive liquid crystal molecules using a fringe field between the two electrodes, although the disclosure is not limited thereto.

The top case 100 is fabricated into a rectangular strip having a plane portion and a lateral portion perpendicular to each other. The top case 100 is coupled to a lateral surface of the mold frame 110 to surround an edge of the liquid crystal display panel 120. As such, the top case 100 serves to protect the liquid crystal display panel 120 and the backlight unit from external shock and to prevent separation of components located between the top case 100 and the bottom cover 190.

The bottom cover 190 is coupled to the mold frame 110 to receive the backlight unit and support the same therebelow.

The mold frame 110 is a plastic or aluminum-alloy molded article having a stepped inner sidewall surface. The liquid crystal display panel 120 is disposed on a stepped portion of the mold frame 110. The mold frame 110 functions to prevent movement of the backlight unit and absorb external shock applied to the backlight unit.

The backlight unit includes a plurality of Light Emitting Diode (LED) packages 150 to generate light, a light guide panel 140 to guide light to the liquid crystal display panel 120, an LED housing reflector 152, a reflective sheet 130, and two micro-lens films 160. In this case, the backlight unit may be classified into an edge type and a direct type according to arrangement of the LED packages 150 that emit light to the liquid crystal display panel 120. The direct type backlight unit emits light to the liquid crystal display panel 120 using the plurality of LED packages 150 arranged on a rear surface of the light guide panel 140, whereas the edge type backlight unit emits light to the liquid crystal display panel 120 using the plurality of LED packages 150 arranged on a lateral surface of the light guide panel 140. In the present invention, an edge arrangement of the LED packages will be described by way of example.

The plurality of LED packages 150 may be mounted on a light source substrate 154 so as to be arranged at both sides or four sides of the light guide panel 140. Each LED package 150 includes a main body 150a, an LED 150b mounted in a recess of the main body 150a, a lead frame (not shown) electrically connected to the LED 150b through a wire (not shown), and a resin material 150c covering the LED 150b.

The light guide panel 140 is located in a light emission direction of the LED 150b to uniformly distribute light emitted from the LED 150b throughout a surface thereof, thereby guiding the light toward the liquid crystal display panel 120. To this end, the light guide panel 140 is formed of transparent heat-resistant polycarbonate, or transparent and high refractive-index acrylic resin. In addition, grooves 142 are formed in a lower surface of the light guide panel 140 to enhance light emission efficacy to the liquid crystal display panel 120.

The LED housing reflector 152 formed of a reflective material is attached to the mold frame 110 between the light guide panel 140 and the LED packages 150, and serves to reflect light, directed to the mold frame 110 above the LED packages 150, toward the light guide panel 140.

The reflective sheet 130 serves to reflect light, directed to the bottom cover 190 below the LED 150b, toward the light guide panel 140. The reflective sheet 130 extends to a position corresponding to the LED housing reflector 152 to reflect light, directed to the bottom cover 190 below the LED 150b, toward the light guide panel 140.

The micro-lens film 160 serves to concentrate and diffuse light emitted from the light guide panel 140. To this end, the micro-lens film 160 includes a base film 162, a lens unit 166 formed at an upper surface of the base film 162, and a back-coating film 164 formed at a lower surface of the base film 162.

The base film 162 serves to provide the micro-lens film 160 with mechanical rigidity and reliability, and may be formed of PET (polyethylene terephthalate), for example.

The back-coating film 164 formed at the lower surface of the base film 162 is coated with a plurality of micro-patterned beads 164a for haze regulation. The micro-patterned beads 164a may prevent absorption of neighboring films or the light guide panel 140, in addition to achieve haze regulation. In other words, when the micro-lens film 160 comes into contact with the light guide panel 140, the micro-patterned beads 164a of the micro-lens film 160 may prevent absorption of the light guide panel 140 as well as absorption between the neighboring micro-lens films 160.

Figure 4:
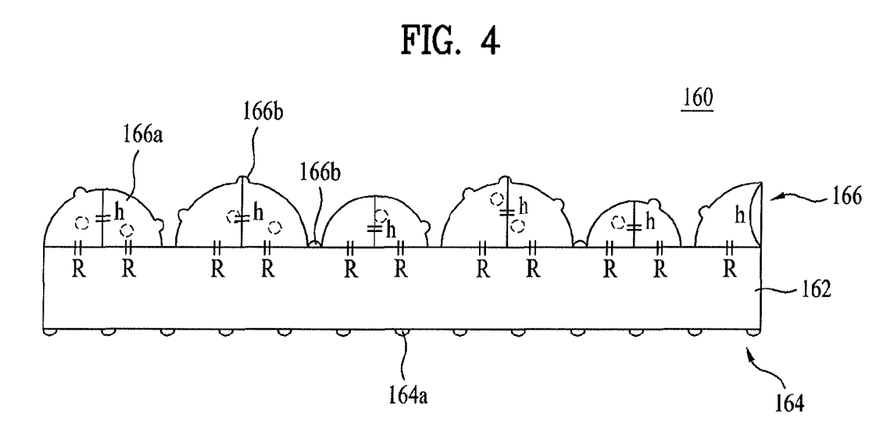
FIG. 4 is a sectional view showing a micro-lens film according to the first embodiment of the present invention.
Figure 5:
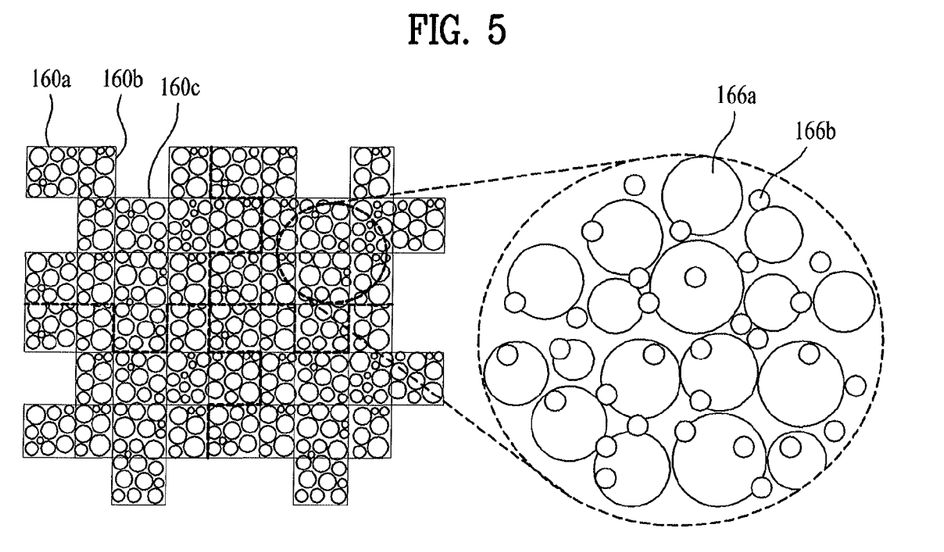
FIG. 5 is a plan view of the micro-lens film shown in FIG. 4.

FIG. 4 is a sectional view showing a micro-lens film according to the first embodiment of the present invention; and FIG. 5 is a plan view of the micro-lens film shown in FIG. 4;

The lens unit 166, as exemplarily shown in FIGS. 4 and 5, includes unit block groups 160a, 160b, and 160c randomly arranged on the top of the base film 162, each of which contains fixed-shape lenses 166a having different sizes. Micro-beads 166b are formed between the fixed-shape lenses 166a and are also randomly formed on surfaces of the fixed-shape lenses 166a.

In this case, the plurality of randomly arranged fixed-shape lenses of the lens unit 166 must have a semispherical fixed-shape, the ratio of height to diameter of which is 1:2, although the lenses have different sizes. In addition, a reference lens for the fixed-shape lenses having different sizes is provided such that the size of the fixed-shape lenses is variable within a range of −15%~+15% on the basis of the reference lens.

The aforementioned semispherical fixed-shape lenses have the highest luminance ratio, whereas unfixed-shape lenses have a low luminance ratio. A lens unit including unfixed-shape lenses and the lens unit including the fixed-shape lenses according to the present invention will be described later in comparison with each other.

Figure 6:
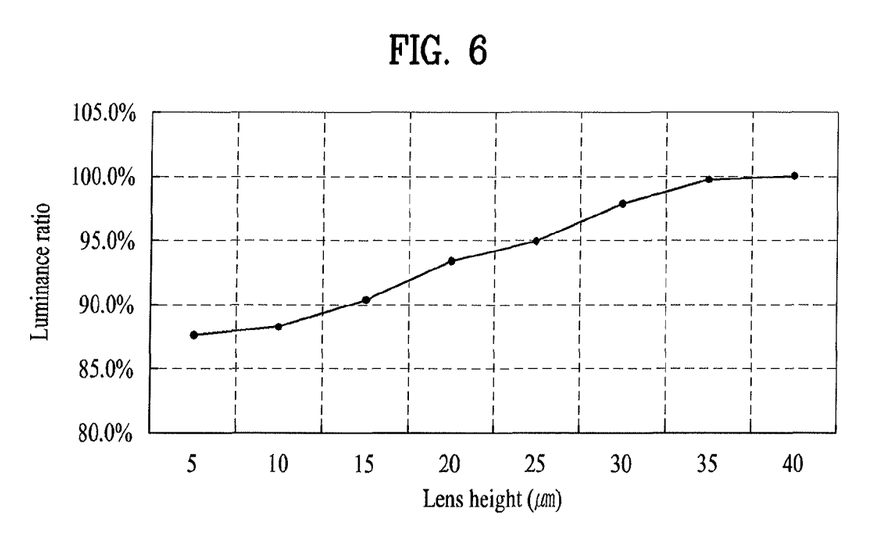
FIG. 6 is a graph showing a luminance ratio depending on a lens shape.

FIG. 6 is a graph showing a luminance ratio depending on a lens shape.

The graph of FIG. 6 shows a luminance ratio in the case in which lenses have the same diameter of 80 μm and vary in terms of the height H. The X-axis represents a lens height (μm) and the Y-axis represents a luminance ratio. Comparing luminance ratios between a plurality of unfixed-shape lenses which has the same diameter of 80 μm and different heights of 5 μm, 10 μm, 15 μm, 20 μm, 25 μm, 30 μm, and 35 μm with fixed-shape lenses which have the same diameter of 80 μm and the same height of 40 μm with each other, it will be appreciated that the highest luminance ratio is accomplished by the lenses have the diameter of 80 μm and the height of 40 μm as exemplarily shown in the graph of FIG. 6. On the other hand, the unfixed-shape lenses having the diameter of 80 μm and different heights with a range of 5 μm~35 μm exhibit a lower luminance ratio than that of the semispherical fixed-shape lenses. It will be appreciated that a luminance ratio increases as a lens height increases from 5 μm to 40 μm, and thus semispherical fixed-shape lens has a higher luminance ratio than that of a semispherical unfixed-shape lens.

Figure 7:
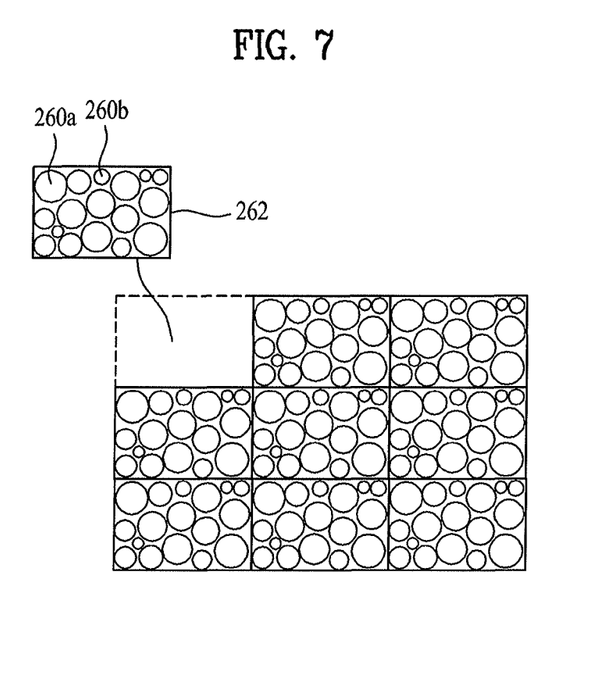
FIG. 7 is a plan view showing micro-lenses in the case in which unit block groups, each containing fixed-shape lenses having different sizes, are arranged in a rectangular grid pattern.

FIG. 7 is a plan view showing micro-lenses in the case in which unit block groups, each containing fixed-shape lenses having different sizes, are arranged in a rectangular grid pattern;

As exemplarily shown in FIG. 7, if unit block groups 262, each of which contains a plurality of fixed-shape lenses 260a and 260b having different sizes, are regularly arranged in a rectangular grid pattern, seams between the rectangular unit block groups 262 define a grid, causing generation of moiré when overlapping the liquid crystal display panel 120. However, according to the present invention, as exemplarily shown in FIG. 5, as the unit block groups 160a, 160b, and 160c, each of which contains the randomly arranged fixed-shape lenses 166a having different sizes, are randomly arranged, seams between the unit block groups 160a, 160b, and 160c have no regularity, which may prevent generation of moiré with respect to the liquid crystal display panel 120.

Moreover, the lens unit 166 includes the micro-beads 166b formed between the fixed-shape lenses 166a to prevent sparkling at the gaps between the fixed-shape lenses 166a. The micro-beads 166b are also randomly formed on surfaces of the fixed-shape lenses 166a, thereby serving to diffuse light. In this case, the micro-beads 166b have a size within a range of 1 μm~2 μm.

In this way, owing to the randomly arranged unit block groups 160a, 160b, and 160c and the micro-beads 166b which are formed between the fixed-shape lenses 166a and formed on surfaces of the fixed-shape lenses 166a, it is possible to prevent the lenses 166a from regularly overlapping the liquid crystal display panel 120, which may prevent generation of moiré.

Figure 8:
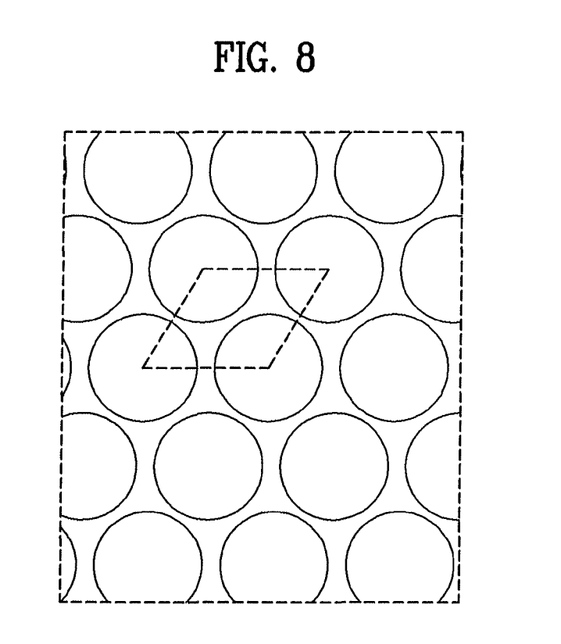
FIG. 8 is a plan view showing a regular arrangement of fixed-shape micro-lenses for explanation of a fill-factor.

In addition, the randomly arranged unit block groups 160a, 160b, and 160c containing the fixed-shape lenses 166a having different sizes and the micro-beads 166b between the fixed-shape lenses 166a may increase a fill-factor, and provision of the semispherical fixed-shape lenses may improve a luminance ratio. The fill-factor (i.e. the area of a lens/the area of a parallelogram), as exemplarily shown in FIG. 8, means a ratio of the area of a lens per unit area. That is, the fill-factor is inversely proportional to gaps between the lenses. Accordingly, increasing the fill-factor may improve a luminance ratio, which may prevent generation of moiré.

Although a liquid crystal display device of the related art includes an optical sheet unit which is formed on a liquid guide panel and includes at least two diffusion sheets and at least one prism sheet, the display device according to the first embodiment of the present invention includes only two micro-lens films as exemplarily shown in FIG. 3 and may achieve a luminance ratio equal to that acquired by the optical sheet unit of the related art including the at least two diffusion sheets and the at least one prism sheet. Accordingly, the display device according to the first embodiment of the present invention may be fabricated with reduced costs owing to a reduced number of optical sheets and exhibit a competitive price.

Figure 9:
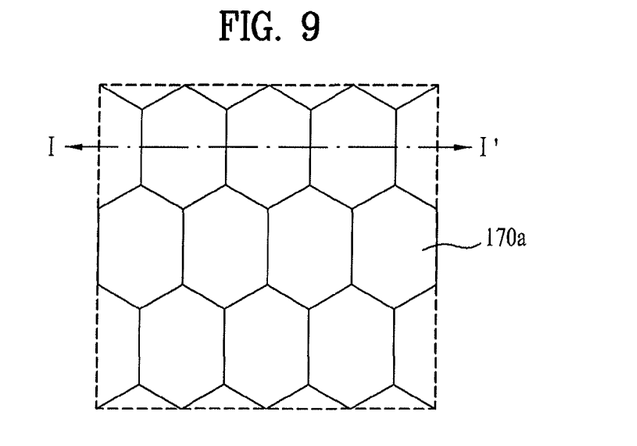
FIG. 9 is a plan view of a micro-lens film according to a second embodiment of the present invention.
Figure 10:
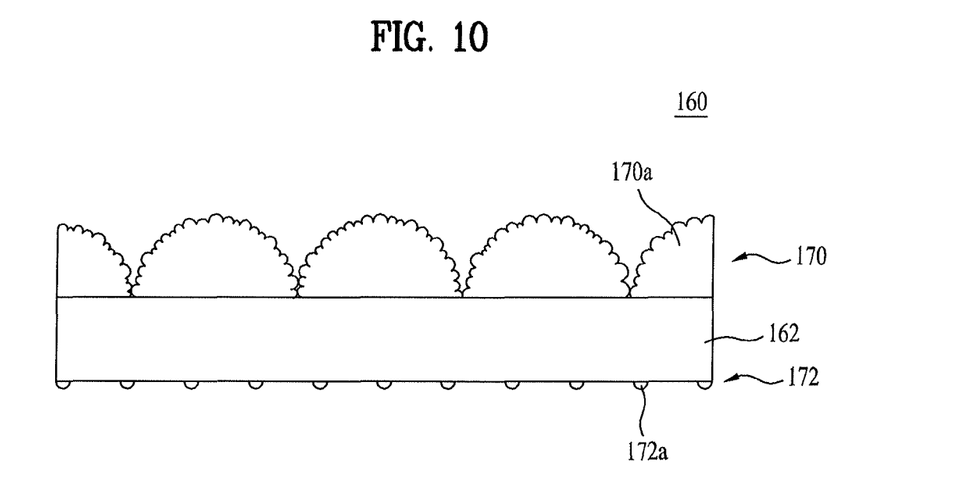
FIG. 10 is a sectional view taken along line I-I' of the micro-lens film shown in FIG. 9.

FIG. 9 is a plan view of a micro-lens film according to a second embodiment of the present invention, and FIG. 10 is a sectional view taken along line I-I' of the micro-lens film shown in FIG. 9.

A display device according to the second embodiment of the present invention includes the same components as those of the display device according to the first embodiment of the present invention except for the micro-lens film, and thus description of the components except for the micro-lens film will hereinafter be omitted.

The micro-lens film according to the second embodiment of the present invention serves to concentrate and diffuse light emitted from the light guide panel 140. To this end, the micro-lens film 160 includes the base film 162, a lens unit 170 formed at the upper surface of the base film 162, and a back-coating film 172 formed at the lower surface of the base film 162.

The base film 162 serves to provide the micro-lens film 160 with mechanical rigidity and reliability, and may be formed of PET, for example.

The back-coating film 172 disposed at the lower surface of the base film 162 is coated with a plurality of micro-patterned beads 172a for haze regulation. The micro-patterned beads 172a may prevent absorption of neighboring films or the light guide panel 140, in addition to achieve haze regulation. In other words, when the micro-lens film 160 comes into contact with the light guide panel 140, the micro-patterned beads 172a of the micro-lens film 160 may prevent absorption of the light guide panel 140 as well as absorption between the neighboring micro-lens films 160.

The lens unit 170, as exemplarily shown in FIGS. 9 and 10, includes a plurality of lenses 170a having a hexagonal bottom, and surfaces of the plurality of lenses 170a are provided with irregular bosses. Providing the surfaces of the lenses 170a with the irregular bosses may improve haze properties. The irregularly bossed surfaces of the lenses 170a may be acquired using a high power pulsed laser, such as a Nd:YAG laser. Since a pulsed laser has different powers on a per pulse basis, bosses may naturally be formed on the entire surface of the lens during molding. In addition, the irregularly bossed surfaces of the lenses 170a may be acquired by changing surface treatment conditions during soft molding. More specifically, a soft mold plating process may regulate a surface roughness via regulation of a plating time. With use of the aforementioned methods, the resulting bosses may have irregular sizes within a range of 0.5 μm~10 μm.

In addition, providing the lenses 170a with a hexagonal bottom may prevent generation of gaps between the plurality of lenses 170a, which may prevent sparkling spots at the gaps, and prevent generation of moiré.

Figure 11A:
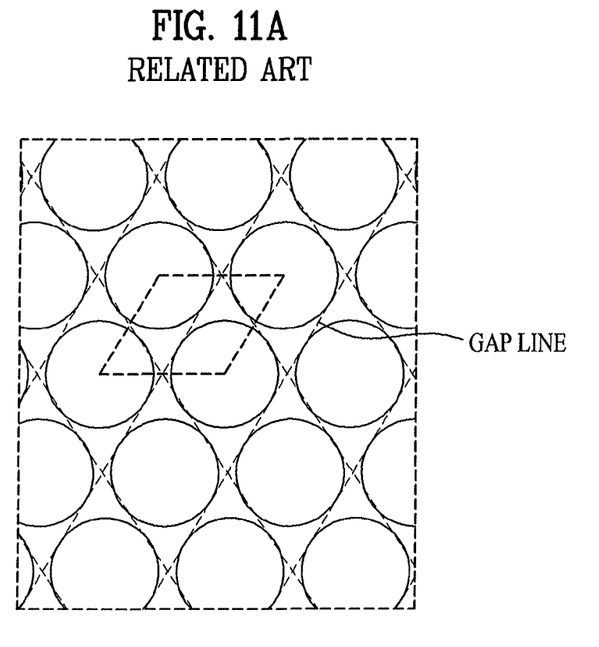
FIGS. 11A and 11B are plan views showing gaps and gap lines of regularly arranged fixed-shape lenses.
Figure 11B:
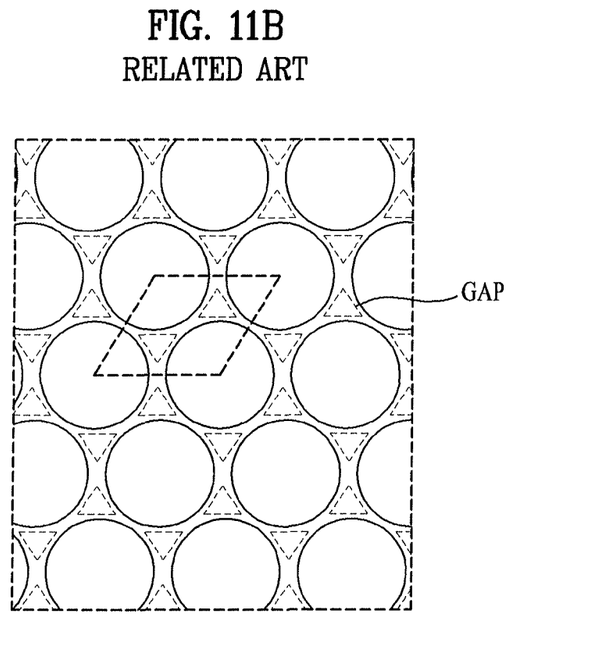

As exemplarily shown in FIGS. 11A and 11B, fixed-shape lenses of the related art are regularly arranged, causing gaps and gap lines therebetween. As the gaps and the gap lines regularly overlap the liquid crystal display panel 120, generation of moiré occurs. Although regularly arranged fixed-shape lenses cause gaps therebetween as described above, irregularly arranged unfixed-shape lenses cause greater gaps therebetween, resulting in a lower fill-factor.

However, according to the present invention, the lenses 170a having a hexagonal bottom are arranged without empty spaces between the neighboring lenses 170a. That is, curved lenses having a semispherical bottom inevitably cause gaps therebetween regardless of arrangement thereof, whereas a plurality of lenses having a hexagonal bottom may be successively arranged without gaps therebetween.

As described above, as exemplarily shown in FIG. 9, the neighboring lenses 170a are arranged without gaps therebetween, which may prevent regular overlap between the gap lines and the display panel caused by the related art. Moreover, such lens arrangement without gaps between the neighboring lenses may ensure a fill factor of substantially 100%. This significantly high fill-factor results in a significantly high luminance ratio.

Figure 12:
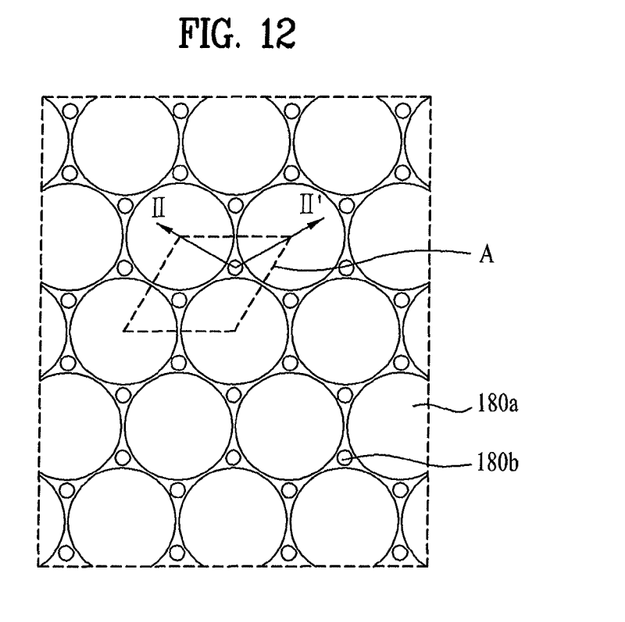
FIG. 12 is a plan view of a micro-lens film according to a third embodiment of the present invention.
Figure 13:
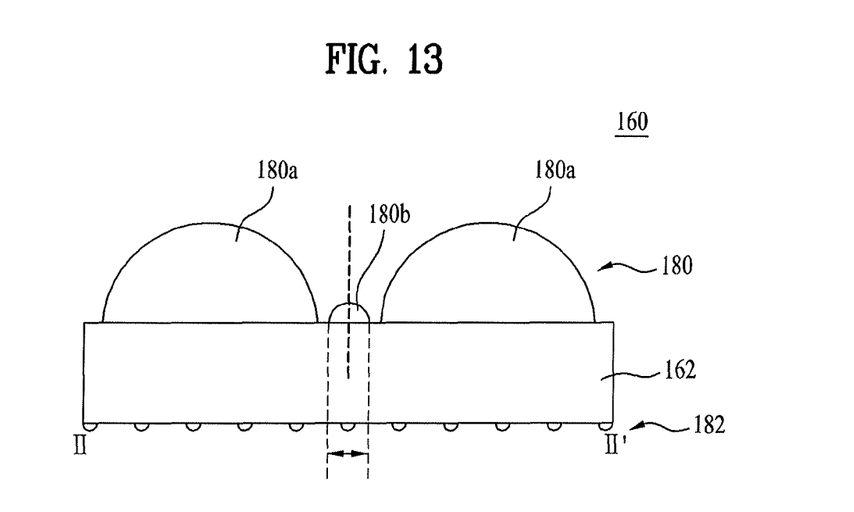
FIG. 13 is a sectional view taken along line II-II' of the micro-lens film shown in FIG. 12.

FIG. 12 is a plan view of a micro-lens film according to a third embodiment of the present invention, and FIG. 13 is a sectional view taken along line II-II' of the micro-lens film shown in FIG. 12. In addition, FIGS. 14, 15, 17, and 18 are plan views showing various embodiments of lenses of the micro-lens film according to the third embodiment of the present invention, and FIG. 16 is a sectional view taken along line of the micro-lens film shown in FIG. 15.

A display device according to the third embodiment of the present invention includes the same components as those of the display device according to the first embodiment of the present invention except for the micro-lens film, and thus description of the components except for the micro-lens film will hereinafter be omitted.

The micro-lens film according to the third embodiment of the present invention serves to concentrate and diffuse light emitted from the light guide panel 140. To this end, the micro-lens film 160 includes the base film 162, a lens unit 180 formed at the upper surface of the base film 162, and a back-coating film 182 formed at the lower surface of the base film 162.

The base film 162 serves to provide the micro-lens film 160 with mechanical rigidity and reliability, and may be formed of PET, for example.

The back-coating film 182 disposed at the lower surface of the base film 162 is coated with a plurality of micro-patterned beads 182a for haze regulation. The micro-patterned beads 182a may prevent absorption of neighboring films or the light guide panel 140, in addition to achieve haze regulation.

The lens unit 180, as exemplarily shown in FIGS. 12 to 18, includes regularly arranged fixed-shape lenses. To minimize gaps between the regularly arranged fixed-shape lenses, micro-lenses may be subordinate to the respective fixed-shape lenses, or may be formed between the fixed-shape lenses to fill the gaps. The fixed-shape lenses may have a size within a range of 10 μm~200 μm, and the micro-lenses may have a size within a range of 1 μm~20 μm.

More specifically, as exemplarily shown in FIGS. 12 and 13, the lens unit 180 may include regularly arranged fixed-shape lenses 180*a* and semispherical micro-lenses 180*b* arranged between the fixed-shape lenses 180*a*. As such, the semispherical micro-lenses 180*b* fill gaps between the regularly arranged fixed-shape lenses 180*a*, which may minimize the gaps.

Figure 14:
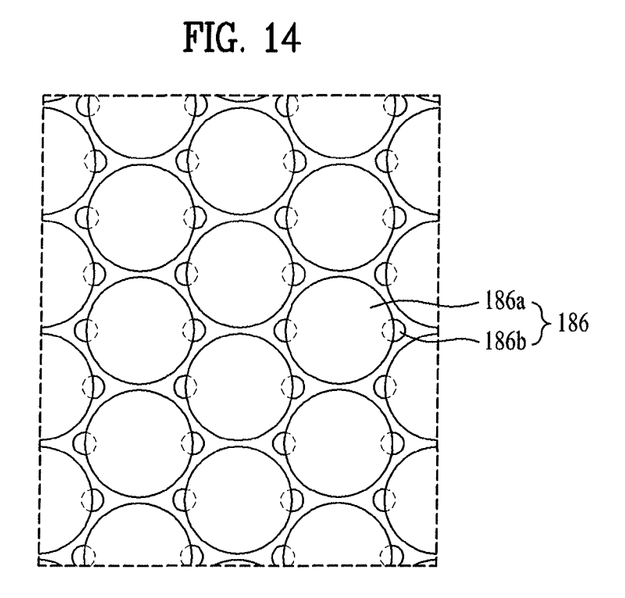
FIGS. 14, 15, 17, and 18 are plan views showing various embodiments of a lens unit of the micro-lens film according to the third embodiment of the present invention.

Alternatively, as exemplarily shown in FIG. 14, the lens unit may include regularly arranged fixed-shape lenses 186*a*, and semispherical micro-lenses 186*b* partially subordinate to both sides of each of the fixed-shape lenses 186*a*. More specifically, a part of each semispherical micro-lens 186*b*, as exemplarily shown in FIG. 14, is embedded in the fixed-shape lens 186 and the remaining part of the semispherical micro-lens 186*b* protrudes from the fixed-shape lens 186. As such, the subordinate semispherical micro-lenses 186*b* fill gaps between the regularly arranged fixed-shape lenses 186*a*, which may minimize the gaps.

Figure 15:
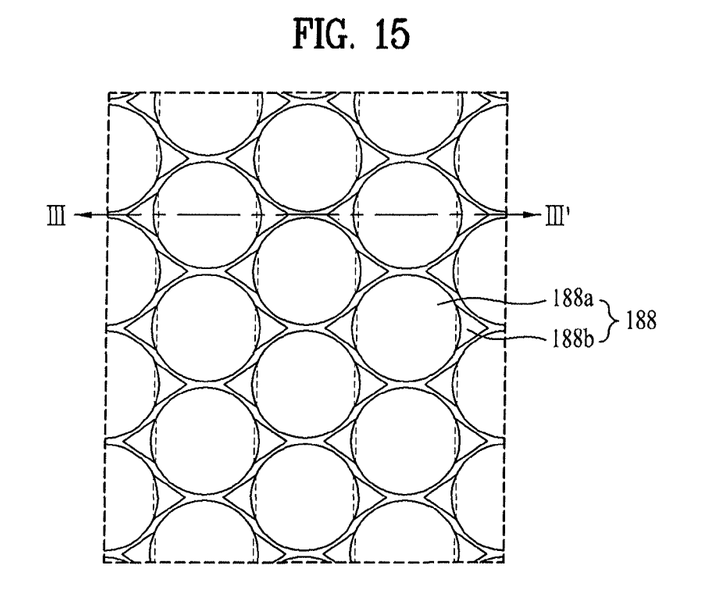
Figure 16:
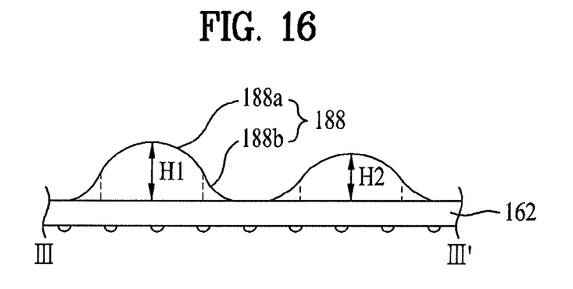
FIG. 16 is a sectional view taken along line III-III' of the micro-lens film shown in FIG. 15.

Alternatively, as exemplarily shown in FIG. 15, the lens unit may include regularly arranged fixed-shape lenses 188*a* and triangular micro-lenses 188*b* subordinate to both sides of each of the fixed-shape lenses 188*a*. In other words, regular arrangement of the fixed-shape lenses 188*a*, as exemplarily shown in FIG. 11B, causes triangular gaps between the fixed-shape lenses 188*a*. As such, the triangular micro-lenses fill the gaps between the regularly arranged fixed-shape lenses, which may minimize the gaps.

In this case, the neighboring lenses 188 of the lens unit may have the same height as exemplarily shown in FIG. 15, or may have different heights (H1>H2 .) as exemplarily shown in FIG. 16. A height difference between the neighboring fixed-shape lenses to which the triangular micro-lenses are subordinate may be within a range of 8 μm~+8 μm. Providing the neighboring lenses 188 with different heights as exemplarily shown in FIG. 16 may prevent absorption between neighboring films or with respect to the light guide panel.

Figure 17:
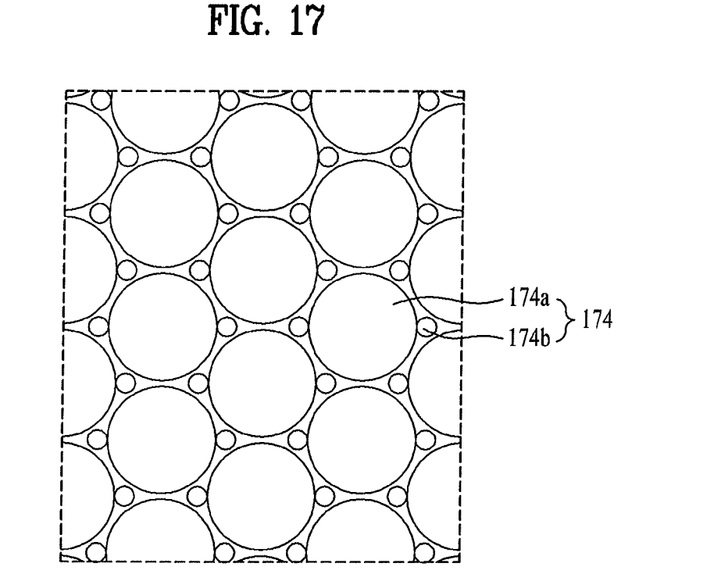

Alternatively, as exemplarily shown in FIG. 17, the lens unit may include regularly arranged fixed-shape lenses 174*a* and semispherical micro-lenses 174*b* configured to come into contact with both sides of each of the fixed-shape lenses 174*a*. More specifically, the micro-lens 174*b* may be formed so as to come into contact at a curved surface thereof with a curved surface of the fixed-shape lens 174*a* to the maximum extent. As such, the semispherical micro-lenses 174*b* fill gaps between the regularly arranged fixed-shape lenses 174*a*, which may minimize the gaps.

Figure 18:
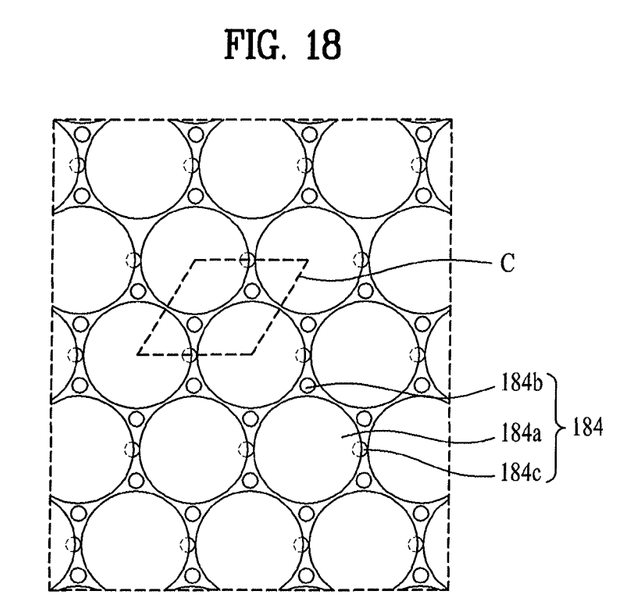

Alternatively, as exemplarily shown in FIG. 18, the lens unit may include regularly arranged fixed-shape lenses 184*a*, semispherical micro-lenses 184*c* partially subordinate to both sides of each of the fixed-shape lenses 184*a*, and semispherical micro-lenses 184*b* arranged in gaps of the fixed-shape lenses 184*a*. As such, the semispherical micro-lenses 184*c* partially subordinate to both sides of the respective fixed-shape lenses 184*a* fill narrow gaps between the regularly arranged fixed-shape lenses 184*a*, and the semispherical micro-lenses 184*b* fill triangular gaps between the regularly arranged fixed-shape lenses 184*a*, which may minimize the gaps.

Table 1 shows luminance ratio and haze data of the micro-lens film according to the third embodiment of the present invention.

In table 1, a column of related art shows a luminance ratio, total transmittance (TT), and haze of a micro-lens film of the related art based on regular arrangement of fixed-shape lenses, a column of case A shows a luminance ratio, TT, and haze in the case in which the lens unit of the micro-lens film includes the regularly arranged fixed-shape lenses 186*a* and the semispherical micro-lenses 186*b* partially subordinate to both sides of each of the fixed-shape lenses 186*a* as exemplarily shown in FIG. 14, a column of case B shows a luminance ratio, TT, and haze in the case in which the lens unit of the micro-lens film includes the regularly arranged fixed-shape lenses 188*a* and the triangular micro-lenses 188*b* subordinate to both sides of each of the fixed-shape lenses 186*a* as exemplarily shown in FIG. 15, a column of case C shows a luminance ratio, TT, and haze in the case in which the lens unit of the micro-lens film includes the regularly arranged fixed-shape lenses 174*a* and the semispherical micro-lenses 174*b* attached to both sides of the fixed-shape lenses 174*a* as exemplarily shown in FIG. 17, and a column of case D shows a luminance ratio, TT, and haze in the case in which the lens unit of the micro-lens film includes the regularly arranged fixed-shape lenses 180*a* and the semispherical micro-lenses 180*b* arranged between the fixed-shape lenses 180*a* as exemplarily shown in FIG. 12.

TABLE 1

| Division | Related Art | Case A | Case B | Case C | Case D |
| --- | --- | --- | --- | --- | --- |
| Luminance Ratio | 100% | 104.4% | 103.6% | 105.6% | 105.8% |
| TT | 54.71% | 50.36% | 50.90% | 50.73% | 51.14% |
| Haze | 78.38% | 80.55% | 79.83% | 80.00% | 77.55% |

As described in table 1, the cases A, B, C, and D of the micro-lens film according to the third embodiment of the present invention show a luminance ratio of more than 100%.

In this way, as exemplarily shown in FIGS. 12 to 18, micro-patterned lenses fill gaps between regularly arranged fixed-shape lenses to minimize the gaps, causing an increased fill-factor. The increased fill-factor results in a significantly improved luminance ratio.

As is apparent from the above description, a display device according to a first embodiment of the present invention includes unit block groups each containing randomly arranged fixed-shape lenses having different sizes, and micro-beads randomly formed between the fixed-shape lenses or on surfaces of the fixed-shape lenses. In this case, random arrangement of the unit block groups may prevent generation of moiré, and the micro-beads between the fixed-shape lenses or on surfaces of the fixed-shape lenses may increase a fill factor and consequently a luminance ratio. The luminance ratio may further be increased by the fixed-shape lenses.

Further, a display device according to a second embodiment of the present invention includes a micro-lens film on which a plurality of lenses having a hexagonal bottom is arranged. Arrangement of the plurality of hexagonal lenses may eliminate gaps between the plurality of lenses and consequently prevent sparkling spots at the gaps. Elimination of gaps may prevent generation of moiré. No gaps between the neighboring lenses may achieve a fill factor of substantially 100%, resulting in a high luminance ratio.

Furthermore, a display device according to a third embodiment of the present invention includes regularly arranged fixed-shape lenses, and micro-patterned beads subordinate to the fixed-shape lenses or formed between the fixed-shape lenses to minimize gaps between the fixed-shape lenses. Minimization of gaps may prevent generation of moiré and achieve an increased fill factor and consequently an increased luminance ratio. The luminance ratio may further be increased by the fixed-shape lenses.

It will be apparent that, although the preferred embodiments have been shown and described above, the invention is not limited to the above-described specific embodiments, and various modifications and variations can be made by those skilled in the art without departing from the gist of the appended claims. Thus, it is intended that the modifications and variations should not be understood independently of the technical sprit or prospect of the invention.

What is claimed is:

1. A display device comprising:
   a display panel configured to display an image;
   a plurality of Light Emitting Diodes (LEDs) configured to generate light to supply light to the display panel;
   a light guide panel configured to guide light to the display panel; and
   a micro-lens film that concentrates and diffuses light emitted from the light guide panel, the micro-lens film including a base film, a lens unit at an upper surface of the base film, and a back-coating film at a lower surface of the base film,
   wherein the lens unit includes unit block groups randomly arranged at the upper surface of the base film, each unit block group containing randomly arranged fixed-shape lenses having different sizes, and micro-beads randomly arranged on both surfaces of the fixed-shape lenses and the upper surface of the base film.

2. The device according to claim 1, wherein additional micro-beads are between the fixed-shape lenses.

3. The device according to claim 1, wherein the fixed-shape lenses having different sizes are semispherical fixed-shape lenses, a ratio of height to diameter of which is set to 1:2 despite different sizes of the fixed-shape lenses.

4. The device according to claim 1, wherein a reference lens for the fixed-shape lenses having different sizes is provided and the fixed-shape lenses are variable in size within a range of −15%~+15%.

5. The device according to claim 1, comprising an additional micro-lens film.

6. The device according to claim 2, wherein the micro-beads have a size within a range of 1 μm ~2 μm.

7. The device according to claim 1, wherein the back-coating film is located at the lower surface of the base film and is coated with a plurality of micro-patterned beads for haze regulation.

8. A display device comprising:
   a display panel configured to display an image;
   a plurality of Light Emitting Diodes (LEDs) configured to generate light to supply light to the display panel;
   a light guide panel configured to guide light to the display panel; and
   a micro-lens film that concentrates and diffuses light emitted from the light guide panel, the micro-lens film including a base film, a lens unit at an upper surface of the base film, and a back-coating film at a lower surface of the base film,
   wherein the lens unit includes a plurality of lenses having a hexagonal bottom and curved surfaces, and the curved surfaces of the plurality of lenses are provided with irregular-shape bosses.

9. The device according to claim 8, wherein the bosses have irregular sizes within a range of 0.5 μm~10 μm.

10. The device according to claim 8, wherein the bosses are formed via laser processing using a high power pulsed laser such as a Nd:YAG laser.

11. The device according to claim 8, wherein the bosses are formed by regulating a plating time of a soft mold plating process to regulate a surface roughness.

12. The device according to claim 8, wherein the back-coating film is located at the lower surface of the base film and is coated with a plurality of micro-patterned beads for haze regulation.

13. A display device comprising:
   a display panel configured to display an image;
   a plurality of Light Emitting Diodes (LEDs) configured to generate light to supply light to the display panel;
   a light guide panel configured to guide light to the display panel; and
   a micro-lens film that concentrates and diffuses light emitted from the light guide panel, the micro-lens film including a base film, a lens unit at an upper surface of the base film, and a back-coating film at a lower surface of the base film,
   wherein the lens unit includes regularly arranged fixed-shape lenses and micro-lenses between the fixed-shape lenses to minimize gaps between the regularly arranged fixed-shape lenses, each of the micro-lenses being surrounded by the regularly arranged fixed-shape lenses, each of the fixed-shape lenses having a curved surface and being spaced apart adjacent fixed-shape lenses without contact with the adjacent fixed-shape lenses,
   wherein the micro-lenses includes first micro-lenses subordinate to the fixed-shape lenses and second micro-lenses between the fixed-shape lenses, each of the first micro-lenses being positioned in a first gap between adjacent two fixed-shape lenses, each of the second micro-lenses being positioned in a second gap between adjacent three fixed-shape lenses, the second gap being larger than the first gap.

14. The device according to claim 13, wherein each of the first micro-lenses is configured such that semispherical micro-lense is partially subordinate to a surface of each of the fixed-shape lenses.

15. The device according to claim 13, wherein the second gap is a triangular gap between the adjacent three fixed-shape lenses.

16. The device according to claim 13, wherein each of the second micro-lenses is configured such that curved surfaces of the fixed-shape lenses come into contact with curved surfaces of the second micro-lenses.

17. The device according to claim 13, wherein the second micro-lenses between the fixed-shape lenses of the lens unit include semispherical micro-lenses between the fixed-shape lenses.

18. The device according to claim 13, wherein the fixed-shape lenses have a size within a range of 10 μm~20 μm.

19. The device according to claim 13, wherein the micro-lenses have a size within a range of 1 μm~20 μm.

* * * * *